United States Patent [19]

Nimmersjö

[11] Patent Number: 4,800,509
[45] Date of Patent: Jan. 24, 1989

[54] DETECTION OF HIGH RESISTANCE FAULTS IN ELECTRICAL POWER SUPPLY NETWORK

[75] Inventor: Gunnar Nimmersjö, Västerås, Sweden

[73] Assignee: ASEA Aktiebolag, Västerås, Sweden

[21] Appl. No.: 942,988

[22] Filed: Dec. 18, 1986

[30] Foreign Application Priority Data

Dec. 20, 1985 [SE] Sweden .................................. 8506063

[51] Int. Cl.$^4$ .......................... G06F 15/56; G01R 31/08
[52] U.S. Cl. ..................................... 364/492; 324/509;
324/522; 361/44; 361/82; 364/483; 364/578
[58] Field of Search ................ 364/483, 481, 492, 495,
364/500, 578, 582; 324/509, 521, 522, 534;
361/42, 44, 65, 82

[56] References Cited

U.S. PATENT DOCUMENTS

| | | | |
|---|---|---|---|
| 4,281,386 | 7/1981 | Kondow et al. | 324/522 |
| 4,317,151 | 2/1982 | de Mesmaeker et al. | 361/82 |
| 4,455,612 | 6/1984 | Girgis et al. | 364/483 |
| 4,466,071 | 8/1984 | Russell, Jr. | 364/492 |
| 4,528,611 | 7/1985 | Udren | 361/82 |
| 4,529,929 | 7/1985 | Berggren | 324/509 |
| 4,559,491 | 12/1985 | Saha | 364/492 |
| 4,570,231 | 2/1986 | Bunch | 364/492 |
| 4,591,992 | 5/1986 | Yamaura | 364/483 |
| 4,689,709 | 8/1987 | Isahaya | 364/483 |
| 4,719,580 | 1/1988 | Nimmersjo | 364/483 |

Primary Examiner—Parshotam S. Lall
Assistant Examiner—Kevin J. Teska
Attorney, Agent, or Firm—Watson, Cole, Grindle & Watson

[57] ABSTRACT

High resistance ground faults on a transmission line of an electrical power transmission network are detected with the aid of a device comprising a travelling wave model of the line located in measuring stations (P, Q) at either end of the line, which permits the voltage distribution along the line, seen both from P and from Q, to be obtained. A voltage $\Delta U_{Qp}$ is formed as the difference between a votlage in station P, calculated in the travelling wave model in Q, and the corresponding voltage one period earlier. A voltage $\Delta U_{Pp}$ is formed as the difference between a voltage calculated in the travelling wave model at P and the corresponding voltage one period earlier. The corresponding voltage differences $\Delta U_{Pq}$ and $\Delta U_{Qq}$ are calculated for station Q. The voltage difference $\Delta P$ is then formed as the difference between $\Delta U_{Qp}$ and $\Delta U_{Pp}$, and the corresponding $\Delta Q$ is formed as the difference between $\Delta U_{Pq}$ and $\Delta U_{Qq}$. Fault detection is obtained when $\Delta P > \epsilon_p$ or when $\Delta Q > \epsilon_q$, where $\Theta_p$ is the accepted voltage difference at P and $\epsilon_q$ is the corresponding value at Q.

16 Claims, 3 Drawing Sheets

DETECTION OF HIGH RESISTANCE FAULTS IN ELECTRICAL POWER SUPPLY NETWORK

TECHNICAL FIELD

The present invention relates to a method and a device for detecting high resistance faults in a transmission line of a network for the distribution or transmission of electrical power, in which supply of power to the transmission line that is to be protected takes place, at least from one of the end points of the transmission line, and in which that part of the network which is to be protected is provided with a measuring device in a station or the like at either end of the object to be protected.

Distribution and transmission power supply networks have to be protected against faults in such a way that a faulty component or transmission line is automatically disconnected with the aid of an associated circuit-breaker. This is necessary if it is desired to minimize the risk of personal injury and fire, and the need for reliable fault sensing also applies to high impedance faults which will give rise to relatively low fault currents. Ground faults, in particular, may have high fault resistances.

BACKGROUND ART, PROBLEMS

The embodiment of a ground fault protection is, at the present time, determined primarily by the size of the network, its grounding and the regulations which apply to electric heavy current installation with regard to permissible voltages in the case of ground faults on a grounded component. In view of the different appearances of the networks, therefore, several different types of measurement criteria are currently used.

An ungrounded network may be used when the total length of line of the network is not too great. In that way, any ground fault current which appears will be limited by the capacitive reactance of the network to ground and by a possible transition resistance existing at the site of the fault. In this connection, directional current relays are used which are sensitive to ground fault currents that are capacitive relative to the neutral point voltage.

Direct-grounded networks are seldom used at the distribution level since any ground fault current could assume very high values. On the other hand, direct grounding is commonly used for the transmission networks. Since direct grounding implies that the neutral point voltage of the network is zero, the ground fault current is utilized only for selective ground fault detection or for disconnection of a faulty transmission line.

Grounding via neutral point resistors larger than 5Ω occurs in small and medium-sized networks. The neutral point resistor is chosen such that a sufficiently active current (or—as it is also called—resistive current, that is, a current which is in phase with the neutral point voltage) is obtained in the case of a ground fault. The network is protected by directional current relays which are sensitive to ground fault current and which are supplied with the current which passes via the neutral point resistor.

Grounding by means of a neutral point reactor and a neutral point resistor occurs in large networks, in which the capacitive ground fault current would otherwise become too high. The capacitive ground fault current is compensated for by the neutral point reaction so as to obtain a tuned network. For selective disconnection of a faulty component, current direction relays are used which are sensitive to resistive ground fault current, that is, the current through the neutral point resistor. In some applications a special automatic system is available which takes care of the disconnection and connection of the neutral point resistor so as to provide a chance of self-extinguishing of the fault before a relay starts operating and disconnects the line.

Grounding by means of a neutral point reactor occurs in large distribution networks. Otherwise, the same conditions apply as in the case of grounding by means of a reactor or a resistor; however, it is presupposed that the internal resistance of the neutral point reactor will be sufficiently high as to enable the evaluation of a resistive current component.

The components and systems for ground fault measurement, identification and disconnection which are used at present cannot, as is partly clear from the above description, be made identical because of different grounding principles. Nor is it possible to achieve the desirable sensitivity and speed.

In direct-grounded networks, however, it is theoretically possible to achieve a relatively high sensitivity of the ground fault protection devices with a possibility of selective detection of faults with high transition resistances. This type of grounding primarily applies to the transmission networks.

Ungrounded networks also provide relatively good possibilities of selective detection of ground faults with a high transition resistance. However, ungrounded networks are less common, since only small networks would normally be operated in this manner. In addition, ungrounded networks are normally not used in view of the risk of intermittent ground faults.

In networks which are resistance-grounded corresponding to a ground fault current of 2–15 A and networks with combined reactive and resistive grounding, directional current relays which are sensitive to resistive ground fault currents give varying sensitivity to ground faults with a high transition resistance. The sensitivity is largely dependent on the size of the network. Generally, however, it can be said that large networks give limited possibilities of good selective detection of high-ohmic ground faults.

The three most important reasons for the limited sensitivity of current direction relays which are sensitive to resistive ground fault current are as follows:

1. In the case of low ground fault currents, where the capacitive or the inductive component is predominant, the angular fault of the current transformer may cause incorrect measurement.

2. In the case of faults with a low degree of propagation, power and current direction relays have difficulties in measuring $I \times \cos \phi$ in the case of large values of $\phi$, that is, in the range $\phi = 80°$–$90°$.

3. For practical reasons it is not possible to set the sensitivity of the relays at an arbitrarily high level. The reasons for this may be leakage currents in isolators, the possibility of spontaneous contacts of the line by vegetation or the possibility of saline contamination of lines near sea shores. If the sensitivity of the ground fault protection devices is set too high there is, therefore, a likelihood of unjustified or false-alarm trippings.

It is an express wish on the part of the distributors of electrical power to detect ground faults with a higher transition resistance at the site of the fault than is possible at present ($\sim 3$ kΩ). In many transmission networks ground faults with high fault resistances may also occur.

These faults are difficult to detect with, for example, impedance relays.

It is a well known fact that ground faults which are not located and disconnected in time may lead to personal injury or fire. Of special interest in this connection are reversed ground faults, that it, faults in which a phase is interrupted and a ground fault involving feeding via the load object arises in the phase after the moment of interruption. With presently available detection equipment these faults may remain undiscovered for a long period of time.

In addition to the above general description of the various designs of ground fault protection devices and the associated problems, the description of the prior art should also include a reference to Berggren U.S. Pat. No. 4,529,929 assigned to the assignee of this application.

SUMMARY OF THE INVENTION

According to one aspect of the invention there is provided a method of detecting a ground fault on an electrical transmission line extending between two spaced-apart stations which comprises (i) monitoring in each station the difference between (a) the change in voltage on the line at one station calculated with values measured at the other station before and after a suspected fault has occurred and (b) the change in voltage on the line at the one station calculated with values measured at the one station before and after a suspected fault has occurred and (ii) detecting a fault if the measured difference exceeds a preset value. A device for detecting faults represents a further aspect of the invention.

This invention thus relates to a method and a device for detecting ground faults in an electric power distribution network where a number of transmission lines emanate from a power station and in which the ground fault current of each line is measured. According to this method, that line is selected which exhibits the greatest active ground fault current or the greatest ground fault current or the greatest change in ground fault current. Thereafter, the measured ground fault current, or the change therein, in the selected transmission line is compared with at least one predetermined reference value. A fault indication is obtained if the measured level exceeds the reference value.

BRIEF DESCRIPTION OF THE DRAWINGS

The invention will now be further described, by way of example, with reference to the accompanying drawings, in which.

DISCLOSURE OF THE INVENTION, THEORETICAL BACKGROUND

Figure 1:
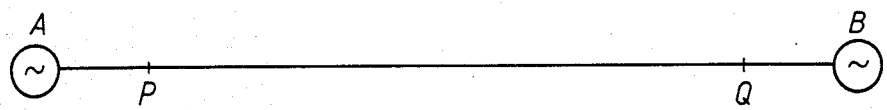
FIG. 1 shows a power line in faultless condition extending between two stations P and Q which are respectively fed from two power sources A and B, FIG. 2 graphically represents the real voltage distribution occurring along the faultless transmission line of FIG. 1 between the power sources.

FIG. 1 shows a power line between two stations or measuring points P and Q. In the example shown the line is fed from two power sources A and B. The line PQ can be conceived to be a transmission line between two networks A and B, a line in a meshed network or a line which connects a power station A with a power drain B.

Figure 2:
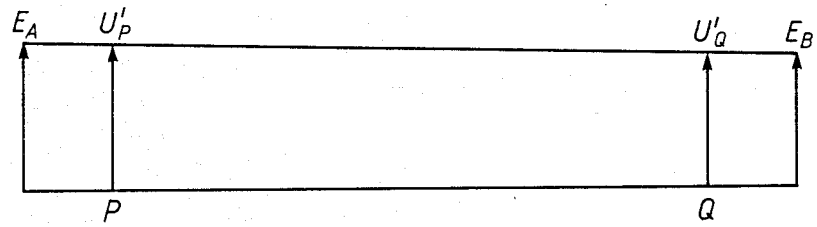

FIG. 2 shows the real voltage distribution along the line PQ of FIG. 1 in a faultless state. $E_A$ and $E_B$, respectively, are the E.M.F.s of the respective power sources, and $U'_P$ and $U'_Q$, respectively, are the measured voltage at P and at Q, respectively.

In the specification filed with U.S. patent application Ser. No. 743,930 on June 12, 1985, also in the name of G. Nimmersjö, (now U.S. Pat. No. 4,719,580) it is made clear how a so-called travelling wave model of a transmission line can be used for calculating the voltage distribution along the line. These calculations are based on the propagation of voltage waves along the line. The method described comprises carrying out, at certain regular time intervals, a measurement of the instantaneous values of the current and the voltage at one end of the line, for example in a station. With the measured values and using the travelling wave model, the voltage at a number of control points along the line can be calculated, thus obtaining the voltage distribution along the line. The disclosure of U.S. Pat. No. 4,719,580 is incorporated herein by reference.

Figure 3:
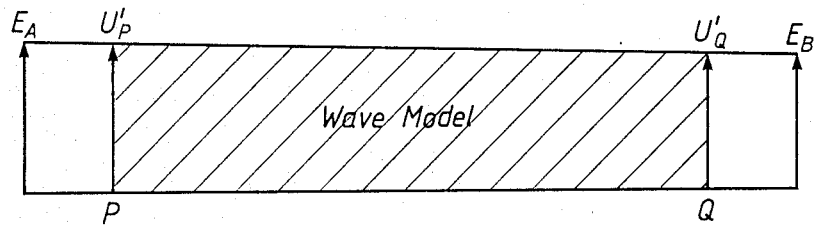
FIG. 3 shows the voltage distribution of FIG. 2, the voltage now being represented by values calculated by means of a travelling wave model located at P or at Q and operating with voltage and current values measured at P and Q.

With the aid of current and voltage values measured respectively in station P and in station Q, the control voltages or the voltage distribution along the line from P towards Q and from Q towards P in a faultless state can be calculated using the travelling wave model. Such a distribution is shown in FIG. 3. Thus the measured voltage distribution obtained in FIG. 2 can be obtained by calculation within limits determined by measurement errors and by lack of precision in the knowledge of parameters to be used in the calculation.

In a theoretically perfect faultless transmission system, the zero sequence voltage and the negative sequence voltage are both zero. In practice they can be assumed to be small, particularly in the case of that part of each of the zero sequence voltage and the negative sequence voltage which is generated by asymmetry in the monitored line. The voltage change which appears on the occasion of a fault may either be conceived to be that difference voltage $\Delta U$ which, in accordance with the Helmhortz-Thévenin theorem, arises at the different points of the line because of the fault, or it may be conceived to be only the zero sequence component and the negative sequence component, respectively, of this voltage change. The conclusions drawn are valid for all interpretations of $\Delta U$. In the faultless case, thus $\Delta U=0$ at all measuring points and this is shown in FIGS. 2 and 3 by the straight line extending between $E_A$ and $E_B$.

Figure 4:
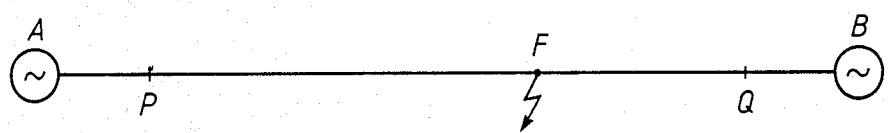
FIG. 4 shows the transmission line of FIG. 1 but with a high resistance fault to ground located on the line between P and Q.
Figure 5:
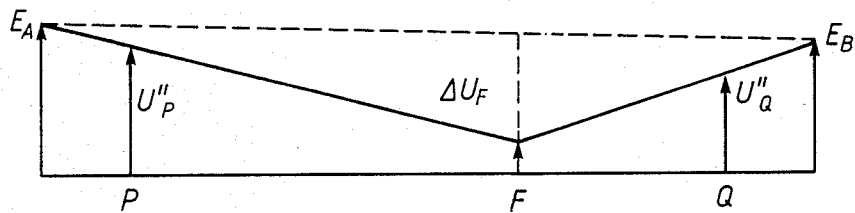
FIG. 5 shows the measured voltage distribution along the line of FIG. 4 after the occurrence of the high resistance ground fault.

When the line according to FIG. 1 is subjected to an internal fault, that is, a fault located between the measuring points P and Q (see FIG. 4), a different real voltage distribution is obtained as shown in FIG. 5. The greatest voltage change $\Delta U_F$ occurs at the site of the fault F. The actual measured voltage at the points P and Q now being represented as $U''_P$ and $U''_Q$.

In the following description the sign ' will indicate the value of a quantity prior to the occurrence of a fault and the sign " will represent the value of a quantity after the occurrence of a fault. Further, to describe the invention, an indexing system defining the quantities in question is needed. The system will be made clear by the following:

An index containing P indicates that the quantity in question has been calculated with values measured at the measuring point P.

An index containing Q indicates that the quantity in question has been calculated with values measured at the measuring point Q.

An index containing p indicates that the value of the quantity in question is calculated for the point P.

An index containing q indicates that the value of the quantity in question is calculated for the point Q.

This means, for example, that $U_{Pq}$ indicates a voltage at Q calculated with values measured at P.

With the aid of this system, the following difference voltages will now be defined:

$$\Delta U_{Pp} = U'_P - U''_P \quad (1)$$

$$\Delta U_{Qq} = U'_Q - U''_Q \quad (2)$$

$$\Delta U_{Pq} = U'_{Pq} - U''_{Pq} \quad (3)$$

$$\Delta U_{Qp} = U'_{Qp} - U''_{Qp} \quad (4)$$

The zero sequence component in the changes is obtained by forming the sum of the phase voltages $U'_R$, $U'_S$ and $U'_T$. Prior to the occurrence of a fault, $U''_R + U''_S + U''_T = 0$, and a simple calculation of $(\Delta U_{Pp})_0$, $(\Delta U_{Qq})_0$, $(\Delta U_{Pq})_0$ and $(\Delta U_{Qp})_0$ in all cases is obtained as $$(\Delta U)_0 = U'_0 = U'_R + U'_S + U'_T$$

The negative sequence component can be obtained by means of a known type of negative sequence filter.

Figure 6:
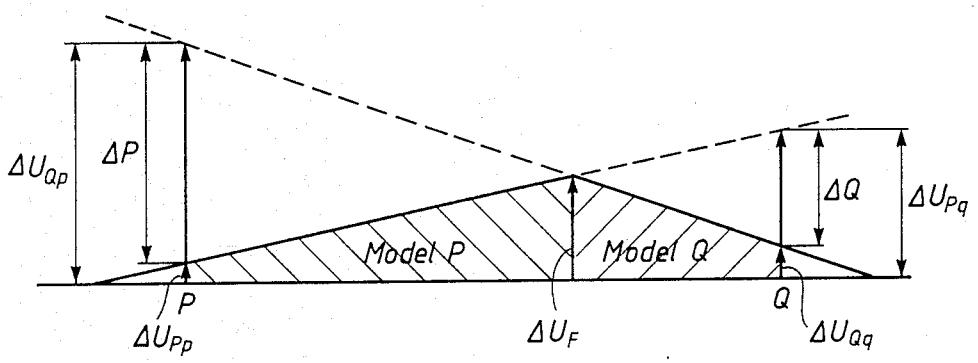
FIG. 6 shows a graph of the voltage difference $\Delta U$ between the measured or calculated voltage prior to a fault and the voltage calculated with a wave model after a fault and plotted at different distances along the line of FIG. 4.

In FIG. 6 the voltage differences according to equations (1), (2), (3) and (4) are plotted graphically. It can be determined that a device at P for calculating the voltage distribution from P towards Q has a line model which is correct between P and F but incorrect beyond the point F, and therefore the calculated voltage distribution is incorrect over the line part FQ. In a similar manner, a device at Q provides a correct picture of the voltage distribution between Q and F but an incorrect picture of the distribution between F and P. However, the two devices together give a correct distribution of the voltage divided between PF for the device at P and QF for the device at Q, F being the only point for which the two devices give the same line model voltage.

The voltage differences $\Delta P$ and $\Delta Q$, as they are represented in FIG. 6, that is, $$\Delta P = \Delta U_{Qp} - \Delta U_{Pp} \quad (5)$$

$$\Delta Q = \Delta U_{Pq} - \Delta U_{Qq} \quad (6)$$

constitute, respectively, an error in measurement at Q as regards the voltage change at P and an error in measurement at P as regards the voltage change at Q, because of the fact that models in the case of a fault at F are not correct for the whole transmission line. $\Delta P$ and $\Delta Q$ can therefore be referred to as model error voltages which would both always be zero if the real transmission line and the model were in precise accordance one with the other. This concept of model error voltage can now be utilized for ground fault indication, since in a faultless state both $\Delta P$ and $\Delta Q$ will be zero. In equations (5) and (6), the mean value, the peak value of the R.M.S. of the difference voltages may be used.

From a practical point of view, fault detection occurs when $$\Delta P > \epsilon_p \quad (7)$$

or when $$\Delta Q > \epsilon_q \quad (8)$$

where $\epsilon_p$ is the accepted voltage difference at P and $\epsilon_q$ is the corresponding value at Q. By trimming these values under normal operation, it is possible, especially when changes in zero sequence voltages are to be sensed for ground fault detection, to set the protection device for high-ohmic faults which give greater deviations of $\epsilon_p$ and $\epsilon_q$, respectively.

Since the mathematical model for calculating the control voltage along the transmission line gives an accurate description of the voltage on the line within the limits determined by errors in measurement etc., this means that high resistance faults can also be discovered. This means that the problems with regard to the detection of high resistance faults, described under "Background Art" above, can be overcome.

As stated, the complete travelling wave model provides control voltages along the whole transmission line. As will be clear from the description of the invention, what is necessary for the fault detection is really only access to the control voltage at the two end points calculated with measured values for the respective opposite end point on the protected line. This means that it is also possible to use a simplified version of the travelling wave model and that a device for carrying out the method according to this inventin will therefore be a considerably simpler design that if the model was required to provide a complete voltage distribution over the entire line.

The method and the device according to the invention can be applied to phase voltages and principal voltages as well as to zero sequence and negative sequence voltages.

EMBODIMENTS OF THE INVENTION

Figure 7:
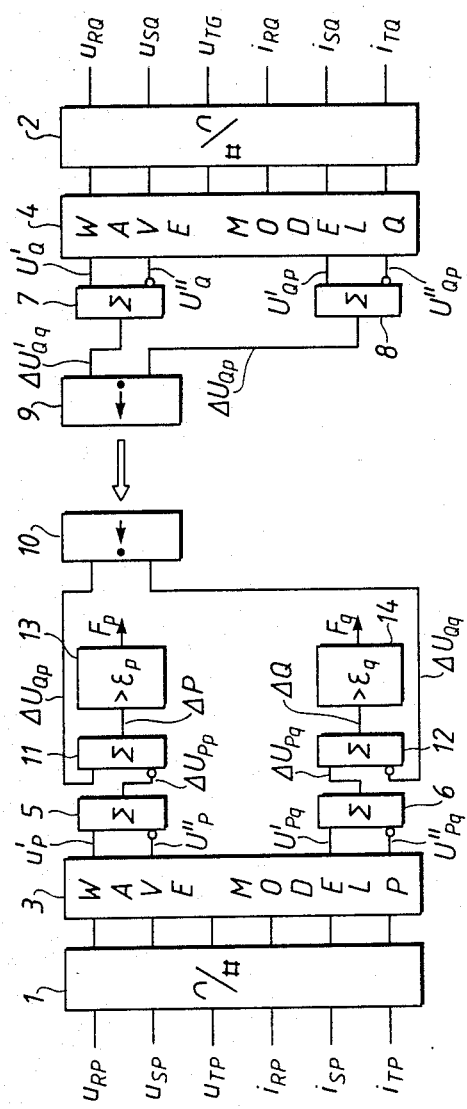
FIG. 7 shows one embodiment of device suitable for the detection of a high resistance ground fault according to the invention which device includes a digital travelling wave model.

A device for carrying out the method according to the invention is shown in FIG. 7. Voltages and currents $u_{RP}$, $u_{SP}$, $u_{TP}$ and $i_{RP}$, $i_{SP}$, $i_{TP}$, measured in station P are converted from analog signals to corresponding digital signals in a measured value converter 1. The corresponding measured value conversion in station Q is performed in a converter 2. The digital measured values are each supplied to a respective digital travelling wave mode 3 and 4.

As will have been clear from the above description of the method, fault detection can take place with the aid of a phase voltage, a principal voltage, a zero sequence or a negative sequence voltage. Thus, the voltage values U delivered from the travelling wave model can be any one of the voltages mentioned; however, all of them must represent the same voltage, for example all values for U must represent principal voltages.

The value of $U''_P$, which may be a mean value of the voltage in question during one period, is compared in a summator 5 with $U'_P$, that is, the mean value of the same voltage measured for the preceding period. In a stationary and in a faultless state, the difference $\Delta U_{Pp}$ is zero. When a new measured value for the next period becomes available, an existing $U''_P$ is transferred into a new $U'_P$ and the new measured value forms a new $U''_P$. This shifting and updating takes place continuously up to the time when a fault occurs, at which moment $\Delta U_{Pp}$ receives a new value different from zero.

With the aid of voltage and current values measured at P, the voltage $U''_{Pq}$, that is, the voltage in station Q, as well as the value of $U'_{Pq}$, that is, the value one period earlier, can be calculated with the travelling wave model. These two values are compared with each other in a summator 6, whereby the difference $\Delta U_{Pq}$ is generated.

To execute the equations (5) and (6), that is, to form the differences $\Delta P$ and $\Delta Q$, values of $\Delta U_{Qq}$ and $\Delta U_{Qp}$ must be transferred from station Q to station P. The transfer takes place via a transmitter 9 and a receiver 10. Of course, the execution could equally well take place in station Q, in which case the values $\Delta U_{Pp}$ and $\Delta U_{Pq}$ must be transferred from station P to station Q.

In accordance with equation (5) the difference voltage value $\Delta P$ is now formed in a summator 11 and the corresponding value $\Delta Q$ is formed in a summator 12. If $\Delta P$ exceeds the accepted difference voltage $\epsilon_p$ in station P, a fault detection signal $F_p$ is obtained via a comparison element 13, and in similar manner a fault detection signal $F_q$ is obtained via a comparison element 14 when $\Delta Q$ exceeds $\epsilon_q$. Since a transfer of $\Delta U_{Qq}$ and $\Delta U_{Qp}$ cannot take place without channel time delay, $\Delta U_{Pq}$ and $\Delta U_{Pp}$ are delayed by a corresponding amount of time before $\Delta P$ and $\Delta Q$ are formed.

The components included in the device, such as analogdigital converters, travelling wave models, summators and comparison elements, can of course be integrated to differing degrees using modern manufacturing techniques.

In an alternative analog design the components 1 and 2 consist of analog measured value converters/interface units and the travelling wave models 2 and 4 are analog versions of such models. Further signal processing can then also be suitably performed in analog units.

As stated in the above description of the method, alternative embodiments of the device comprise using a complete travelling wave model by means of which the voltage distribution can be obtained along the whole transmission line between P and Q, or using a simplified model which only provides a control voltage in the respective opposite station.

What is claimed is:

1. A method for detecting a ground fault on an electrical power transmission line located between two stations (P, Q) included in a multi-phase electrical power transmission system, in which at two end points of the transmission line, a value for current and voltage of each phase is measured, which values are supplied to a travelling wave model of the line in the respective station, the travelling wave model being used to obtain a voltage distribution along the power transmission line as seen from each station, comprising:

monitoring in each station a difference between a change in voltage on the transmission line at one station calculated with values measured at the other station before and after a suspected fault has occurred, and a change in voltage on the line at the one station calculated with values measured at the one station before and after a suspected fault has occurred, comprising the steps of:

determining a value $\Delta U_{Pp}$ as a difference between a present line voltage ($U'_p$), determined in station P and a corresponding line voltage ($U''_p$) one period earlier;

determining a value $\Delta U_{Qq}$ as a difference between a present line voltage ($U'_Q$), determined in station Q and a corresponding line voltage ($U''_Q$) one period earlier;

determining a value $\Delta U_{Pq}$ as a difference between a present line voltage ($U'_{Pq}$) in station Q, calculated in the travelling wave model in station P with values of currents and voltages measured in station P, and a corresponding voltage ($U''Pq$) one period earlier;

determining a value $\Delta U_{Qp}$ as a difference between a voltage ($U'_{Qp}$) in station P, calculated in the travelling wave model in station Q with values of currents and voltages measured in station Q, and a corresponding voltage ($U''Qp$) one period earlier;

determining a value $\Delta P$ as a difference between $\Delta U_{Qp}$ and $\Delta U_{Pp}$;

determining a value $\Delta Q$ as a difference between $\Delta U_{Pq}$ and $\Delta U_{Qq}$; and detecting a fault if the measured difference exceeds a preset value and comprising the step of:

detecting a fault when at least one of $\Delta P > \epsilon_p$ and $\Delta Q > \epsilon q$ is determined, $\epsilon_p$ being the accepted voltage difference in station P and $\epsilon_q$ the corresponding value in station Q.

2. A method according to claim 1, in which $\Delta U_{Pp}$, $\Delta U_{Qq}$, $\Delta U_{Pq}$ and $\Delta U_{Qp}$ are formed as sums of phase voltages for the same period.

3. A method according to claim 1, in which $\Delta U_{Pp}$, $\Delta U_{Qq}$, $\Delta U_{Pq}$ and $\Delta U_{Qp}$ are formed as sums of principal voltages for the same period.

4. A method according to claim 1, in which in each travelling wave model used, the voltage distribution along the entire transmission line, seen from the respective station, is calculated.

5. A method according to claim 1, in which in each travelling wave model used, only the voltage in the respective station and in the remote station is calculated.

6. A method according to claim 1, in which voltages calculated from the travelling wave models are phase voltages.

7. A method according to claim 1, in which voltages calculated from the travelling wave models are principal voltages.

8. A method according to claim 1, in which voltages calculated from the travelling wave models are zero sequence voltages.

9. A method according to claim 1, in which voltages calculated from the travelling wave models are negative sequence voltages.

10. A method according to claim 1, in which the voltage differences $\Delta U_{Pp}$, $\Delta U_{Qq}$, $\Delta U_{Pq}$ and $\Delta U_{Qp}$ are formed as the difference between current values measured in two consecutive half-periods.

11. A method according to claim 1, in which $\Delta U_{Pp}$ and $\Delta U_{Qq}$ are determined by measuring the voltages in the respective stations.

12. A method according to claim 1, in which $\Delta U_{Pp}$ and $\Delta U_{Qq}$ are determined by calculation using the respective travelling wave model.

13. A high resistance fault detecting device for use with a power line located between two stations (P, Q), and having in each station, a travelling wave model and a plurality of summators, in one of said stations a transmitter and in the other of said stations, a receiver and comparator elements, comprising:

a first summator for forming a difference voltage $\Delta U_{Pp}$ equal to a difference between a voltage ($U'_P$) determined in station P during one period and a corresponding voltage ($U''_P$) determined one period earlier, a second summator for forming a difference voltage $\Delta U_{Qq}$ equal to a difference between a voltage ($U'_Q$), determined in station Q during one period and a corresponding voltage ($U''_Q$) determined one period earlier, a third summator for forming a difference voltage $\Delta U_{Pq}$ equal to a difference between a voltage ($U'_{Pq}$) in station Q, calculated in the travelling wave model in station P with values of voltages and currents measured in station P, and a corresponding voltage ($U''_{Pq}$) one period earlier, a fourth summator for forming a difference voltage $\Delta U'_{Qp}$ equal to a difference between a voltage ($U'_{Qp}$), calculated in the travelling wave model in station Q with values of voltages and currents measured in station Q, and a corresponding voltage ($U''_{Qp}$) one period earlier, means to transfer the difference voltages $\Delta U_{Qp}$ ($\Delta U_{Pp}$) and $\Delta U_{Qq}$ ($\Delta U_{Pq}$) view the transmitter and receiver, from station Q to station P (P to Q), a fifth summator for forming a difference $\Delta P = \Delta U_{Pp} - \Delta U_{Qp}$, a sixth summator for forming a difference $\Delta Q = \Delta U_{Pq} - \Delta U_{Qq}$, the device delivering, via a first comparator elements, a first signal ($F_p$) indicating a high resistance ground fault when $\Delta P$ is greater than a voltage difference $\epsilon_p$ accepted at station P and delivering, via a second comparator element, a second signal ($F_q$) indicating a high resistance ground fault when $\Delta Q$ is greater than a voltage difference $\epsilon_q$ accepted at station Q.

14. A device according to claim 13, in which the members thereof are suitable for analog signal processing.

15. A device according to claim 13, in which the first and second summators each determine the respective voltage $U'_P$ and $U'_Q$ by calculation using the travelling wave model.

16. A method of detecting a ground fault on an electrical transmission line extending between two spaced-apart stations comprising (i) monitoring in each station a difference between (a) a change in voltage on the transmission line at one station calculated with values measured at the other station before and after a suspected fault has occurred, and (b) a change in voltage on the line at the one station calculated with values measured at the one station before and after a suspected fault has occurred, and (ii) detecting a fault if the measured difference exceeds a preset value.

* * * * *